(12) United States Patent
Gordon et al.

(10) Patent No.: US 6,215,673 B1
(45) Date of Patent: Apr. 10, 2001

(54) HOT PLUG PCI RETAINER AND ACTUATOR

(75) Inventors: Glen P. Gordon, Federal Way; Anthony P. Valpiani, Graham; Ronald C. Flamm, Olympia, all of WA (US); Anthony Leuthe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/384,390

(22) Filed: Aug. 27, 1999

(51) Int. Cl.[7] ............................. H05K 5/00; H05K 7/14; H01R 13/62
(52) U.S. Cl. .................. 361/801; 361/748; 361/798; 361/754; 439/327; 211/41.17
(58) Field of Search ..................................... 361/683, 686, 361/726, 727–732, 736, 737, 740, 747, 748, 752, 754, 755, 798, 801; 439/345, 356, 327, 135; 211/41.17

(56) References Cited

U.S. PATENT DOCUMENTS

| | | | |
|---|---|---|---|
| 4,226,491 | * 10/1980 | Kazama et al. | 339/17 LM |
| 4,697,303 | * 10/1987 | Matsui et al. | 16/112 |
| 4,740,164 | * 4/1988 | Schulz et al. | 439/64 |
| 5,034,846 | * 7/1991 | Hodge et al. | 361/119 |
| 5,398,156 | * 3/1995 | Steffes et al. | 361/683 |
| 5,428,507 | * 6/1995 | Chatel et al. | 361/798 |
| 5,601,349 | * 2/1997 | Holt | 312/265.6 |
| 5,731,763 | * 3/1998 | Herweck et al. | 340/825.69 |
| 5,822,196 | * 10/1998 | Hastings et al. | 361/801 |
| 6,069,796 | * 5/2000 | Hastings et al. | 361/754 |

* cited by examiner

Primary Examiner—Leo P. Picard
Assistant Examiner—Anatoly Vortman
(74) Attorney, Agent, or Firm—Antonelli, Terry, Stout & Kraus, LLP

(57) ABSTRACT

A hot plug retainer and actuator is used on a chassis for releasably securing a component on the chassis. The retainer and actuator includes a one piece body having a first portion, a second portion and a living hinge pivotably connecting the first and second portions to one another for opening and closing the actuator.

26 Claims, 4 Drawing Sheets

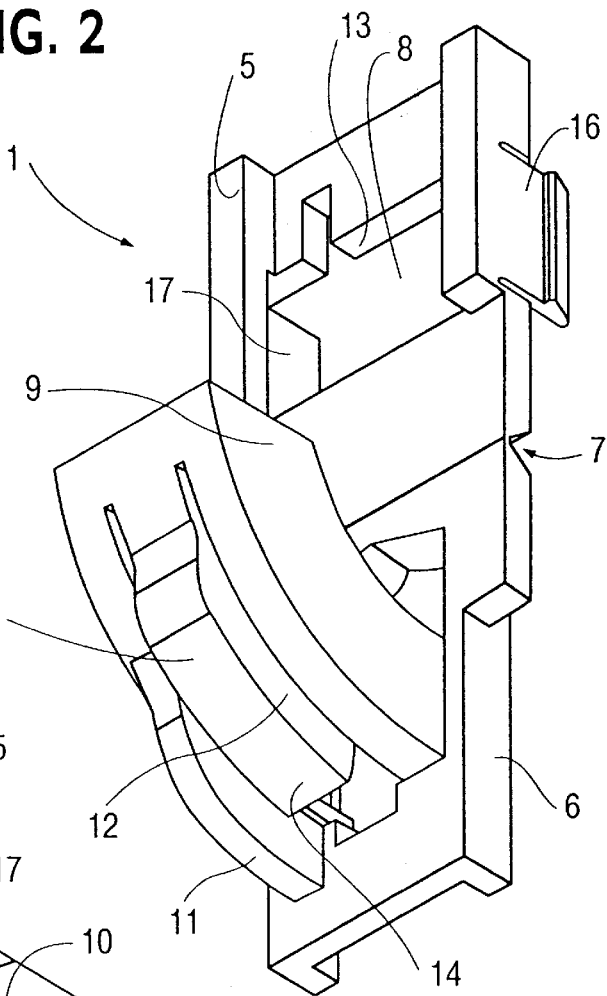
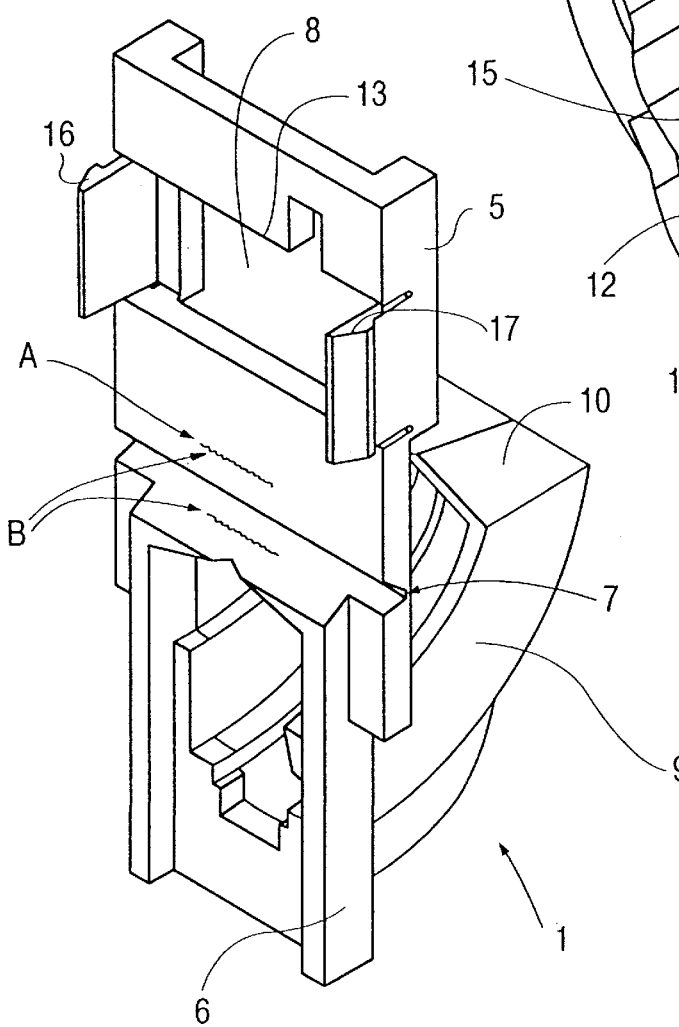

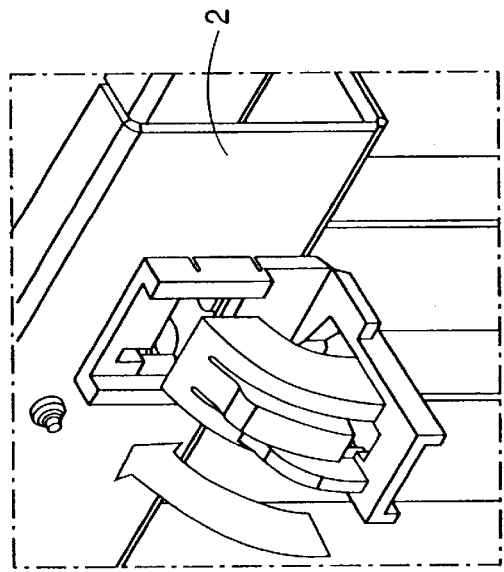
FIG. 4
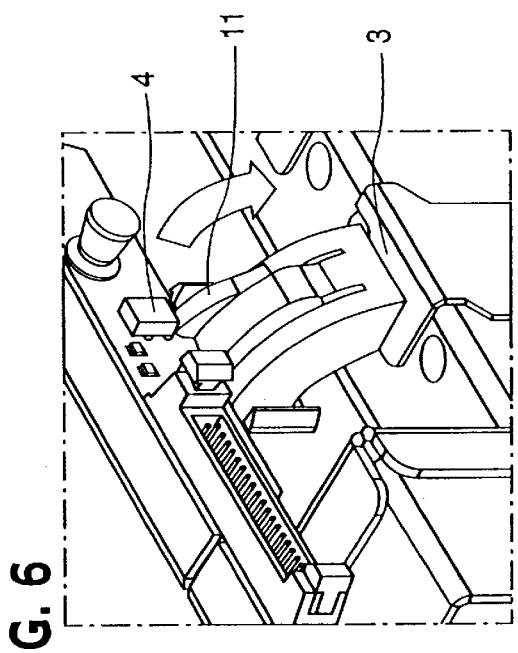
FIG. 6
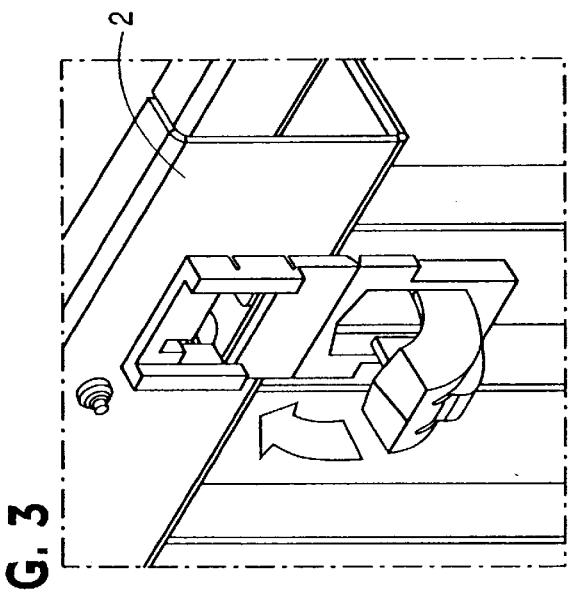
FIG. 3
FIG. 5

HOT PLUG PCI RETAINER AND ACTUATOR

TECHNICAL FIELD

A hot plug retainer and actuator holds or retains any electronic card or blanking panel into an input/output chassis of an electronic system, and actuates a switch that informs the user that the card is installed and is ready for use.

BACKGROUND

A trend in the computer industry is to servers having multiple components such as power supplies, fans and PCI cards, for example, a four-way server which has four redundant components inside and an eight-way server containing eight redundant components. An advantage of these servers is that if one component in a server goes down, the server can still keep running, e.g., a user can replace a defective electronic card or other component using "hot swapping" without crashing the system.

The most common method for holding down a PCI card is to use a screw as illustrated in FIG. 7. A screw implementation is disadvantageous in a hot-swap system because too much time is required to remove/replace the screw, and there is a danger that the loosened screw could fall onto powered components to result in an electrical disaster. One disadvantageous hot plug PCI retainer and actuator eliminates the need for this screw, thus reducing part count and loose hardware. However, this known retainer and actuator requires additional parts such as metal hinges or mounting hardware on the chassis. This can increase the required thickness/strength of the sheet metal of the chassis, thereby adding weight and increasing cost.

SUMMARY

An improved hot plug retainer and actuator for use on a chassis is disclosed. The actuator includes a one piece body having a first portion, a second portion and a living hinge pivotably connecting the first and second portions to one another for opening and closing the actuator.

These and other features of the improved hot plug retainer and actuator will become more apparent from the following description when taken in connection with the accompanying drawings which show, for purposes of illustration only, one example in accordance with the present invention.

BRIEF DESCRIPTION OF THE DRAWINGS

FIG. 1 is a view from slightly above and to the right of the side of the hot plug retainer and actuator to be mounted against a chassis.

FIG. 2 is a view from slightly below and to the right of the side of the hot plug retainer and actuator opposite to that seen in FIG. 1.

FIG. 3 is a view of a portion of a chassis of an electronic system, particularly a processor in a server with the hot plug retainer and actuator of FIGS. 1 and 2 mounted on the chassis at a first upper portion of the actuator, the arrow in the drawing showing the direction of pivoted movement of a second lower portion of the actuator relative to the first portion and the chassis about a living hinge of the actuator body as the actuator is moved from a full open position of the actuator toward a closed position where it retains an electronic card or other component in the chassis.

FIG. 4 is a view like FIG. 3 showing the second position pivoted approximately 90° from its full open position in FIG. 3.

FIG. 5 is a view from the opposite ends of the chassis shown in FIGS. 3 and 4 and depicting a projection on the second portion extending through an opening in the first portion of the actuator and an aligned opening in the chassis in which the first portion is mounted as the actuator is moved toward its closed position.

FIG. 6 is a view similar to FIG. 5 but showing the actuator in its closed position over the sheet metal bracket of an electronic card or other component for retaining the component in the chassis of the processor.

DETAILED DESCRIPTION

The following detailed description will focus on disclosing implementation of the retainer/actuator of the present invention in a PCI bus and server chassis environment, although the present invention is not limited to use in such environments. For example, the present invention could find use in any type of electronic environment where there is a need to secure electronic cards.

Figure 7:
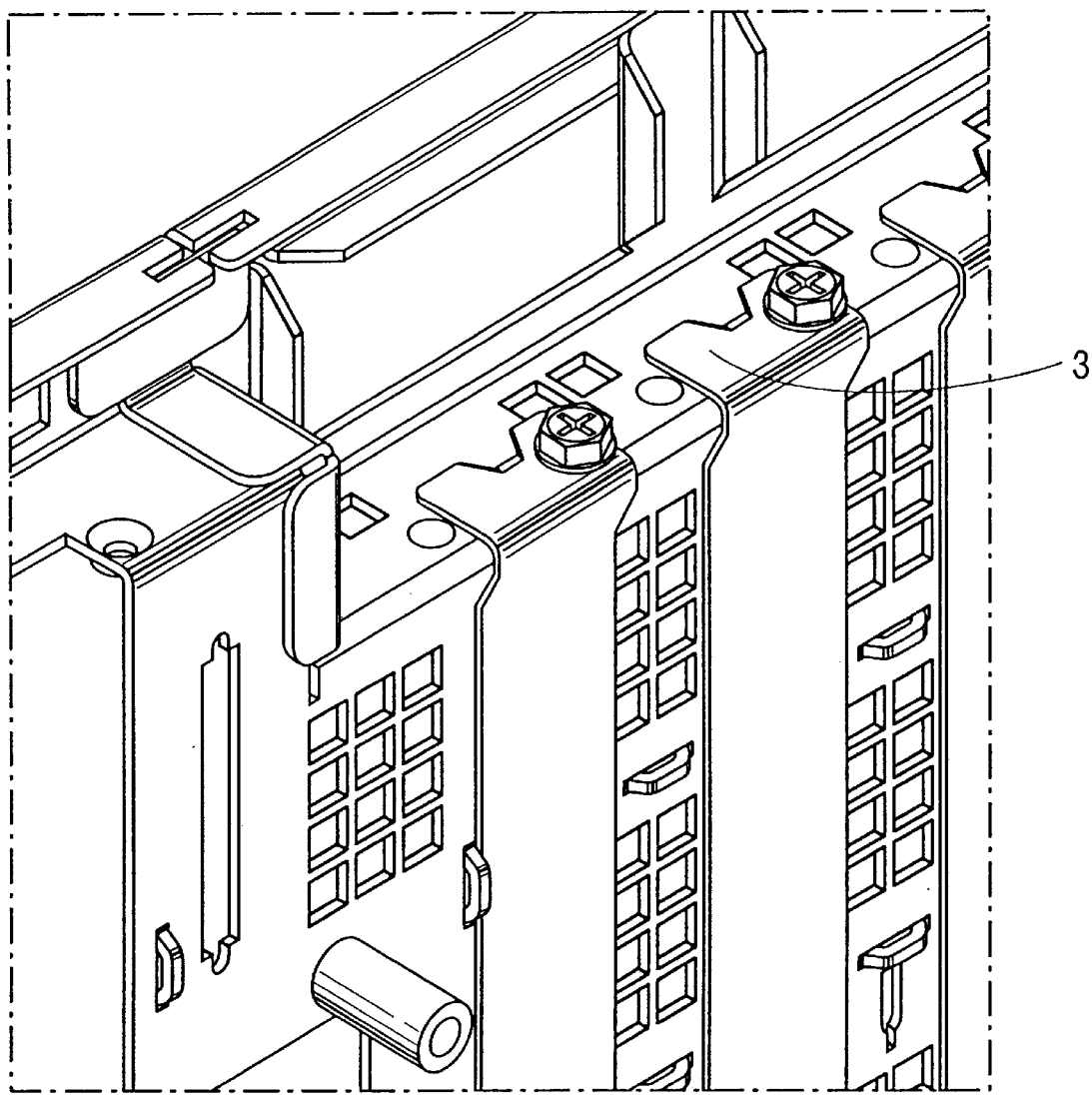
FIG. 7 is a view of a sheet metal bracket of a PCI card which is secured on an I/O chassis using a screw.
Figure 8:
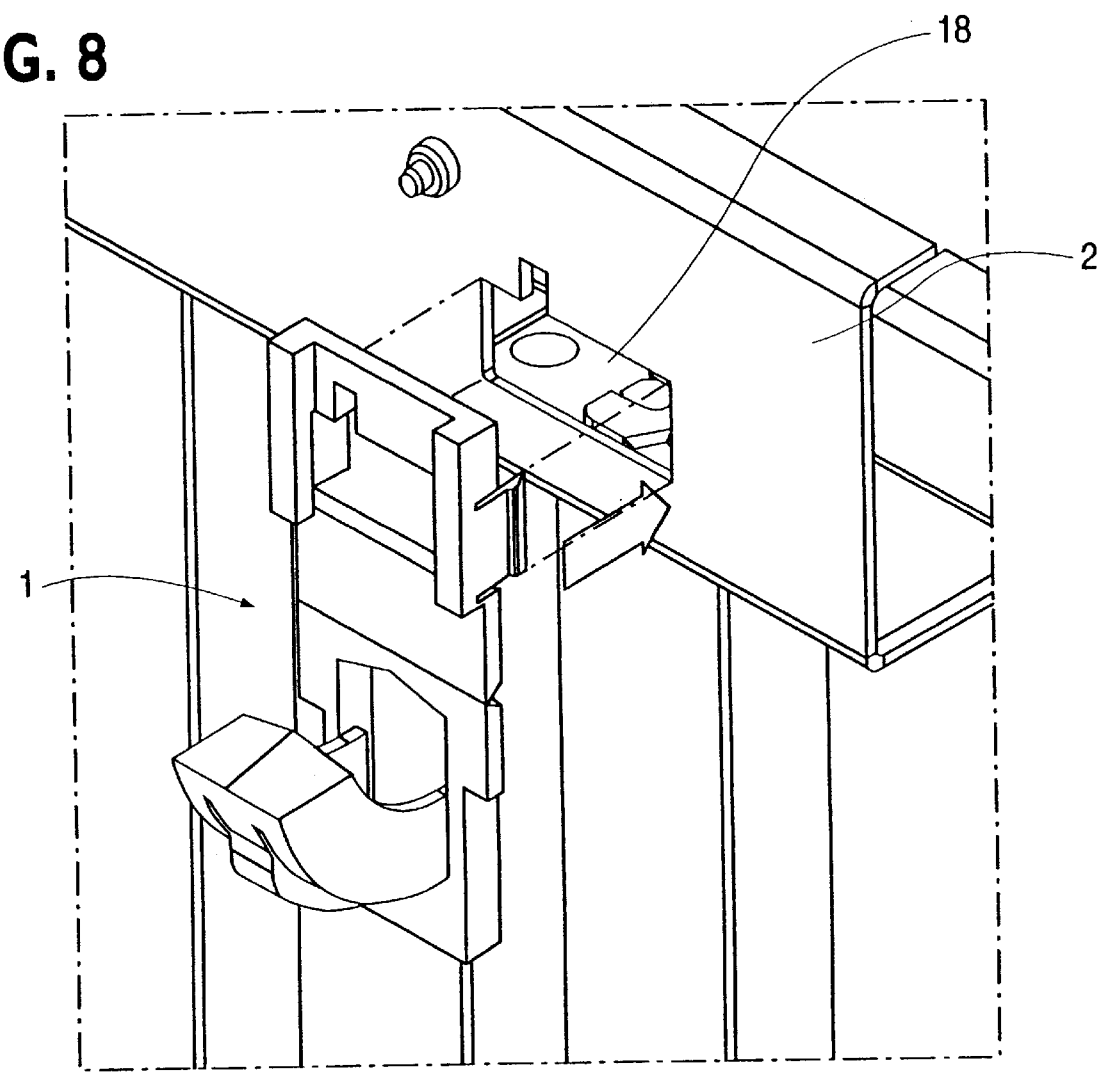
FIG. 8 is a view above and to one side of the chassis in FIGS. 3–6 showing an opening in the chassis and the retainer and actuator spaced therefrom prior to mounting the actuator on the chassis.

Referring now to the drawings, the hot plug PCI retainer and actuator 1 in FIGS. 1–6 and 8 is used on an input/output (I/O) chassis 2 of a server. The server can be part of in a multiple-way server. The actuator 1 is used for holding or retaining any PCI card or blanking panel into the chassis 2 by way of a metal bracket 3 connected to the card or blanking panel. The actuator 1 actuates a switch 4 on the chassis that informs the user that the PCI card is installed and is ready for use.

The actuator 1 comprises a one piece plastic body having a first portion 5, a second portion 6 and a "living hinge" 7 pivotably connecting the first and second portions to one another for opening and closing the actuator. The living hinge allows the actuator 1 to be molded as one part. The living hinge has no internal moving parts like conventional hinges. Instead, the hinge 7 is a feature that is molded into the one piece body of the actuator and uses the inherent properties of the plastic to create a hinge that can be exercised many times. See FIGS. 3–6.

The first portion 5 of the actuator 1 includes an opening 8 extending therethrough. The second portion 6 includes a projection 9 which moves into and out of the opening 8 in the first portion during closing and opening of the actuator, respectively. The projection 9 is curved so as to extend along a quadrant of a circle having its center at the living hinge 7. The outer, free end 10 of the projection contacts the metal bracket 3 in the closed position of the actuator, FIG. 6, to retain the PCI card or blanking panel in the chassis 2.

The projection 9 has a cam 11 formed thereon for actuating the switch 4 on the chassis 2 when the actuator is closed to inform a user that a PCI component retained by the actuator is installed and ready for use. The cam has a highly polished surface which minimizes friction between the cam 11 and switch 4. The projection 9 also includes a locking beam 12 supported as a cantilever at its outer end on the projection. The inner, free end 14 of the locking beam 12 is spaced from the adjacent second portion 6 to receive a cooperating end 13 of the first portion 5 when the actuator is closed. The outer peripheral surface 15 of the locking beam 12 is cammed progressively outwardly so that upon closing the actuator, the locking beam is resiliently pressed inwardly by cooperation with the surface 13 of the first portion 5. Upon reaching the closed position of the actuator, the free end 14 of the locking beam clears the cooperating surface 13 creating an audible, tactile snap with the surface 15 entering the free space at the end of the locking beam. The audible snap, upon closure of the actuator, enables a user to audibly understand (in addition to any indication provided by the switch 4) when the actuator is closed.

The actuator 1 is formed with integral snap tabs 16 and 17 for stationarily mounting the first portion 5 in an opening 18 of the chassis 2 simply by snapping the actuator into place. The actuator does not need to be removed for actuation. The second portion 6 of the actuator can be pivoted about the living hinge 7 relative to the first portion 5 and the chassis 2 without providing additional parts such as metal hinges or mounting hardware on the chassis. Such is advantageous in a hot swapping environment where use and simplicity of construction and installation/removal are highly desired attributes.

Together the actuator 1 and the chassis 2 form an apparatus for releasably retaining a component in a computer server through the use of a one piece plastic part mounted on the chassis. The actuator 1 can be used in any I/O design where the PCI cards or other components are being extracted, removed or replaced from the chassis. In the disclosed example, the PCI cards are extracted, removed or replaced from the top of the chassis.

The actuator 1 can be molded from many different plastic materials, as long as the material provides the flexibility to sustain hundreds of opened/closed cycles across the living hinge. Polypropylene plastic is the most common living hinge material, and the actuator was originally designed using this material. It was later apparent that polypropylene was not stiff enough, and would not retain itself adequately in the chassis. Also, it did not provide an audible "snap" on the locking beam upon closure. The stiffness is necessary to withstand shock and vibration testing, and the snap upon closure is necessary for the user to understand when the actuator is closed in the system.

Research and experimentation produced a molded actuator made from polybutylene terephthalate (PBT) polyester resin which met both of the above requirements. This material has the flexibility to accommodate the living hinge, yet is stiff enough to retain itself in the chassis. Also, the locking beam provides an audible, tactile snap when closing the actuator.

The mold for the actuator 1 was re-designed so that the flow of plastic was across the living hinge (see arrow A in FIG. 1, not perpendicular to it). This process aligns the polymer chains in a direction along the length of the hinge 7 as shown schematically at B in FIG. 1, which reduces stress in the flexible area and allows more cycles across the living hinge. The selection of this material and the special design of the mold to so direct the flow of molten plastic during molding produces the aforementioned combination of characteristics which enhance the performance and life of the actuator.

While we have shown and described only one example herein, it is understood that numerous changes and modifications as known to those skilled in the art could be made in the actuator, the apparatus and method. For example, the actuator and chassis are mentioned in accordance with the PCI card standard in the disclosed example, but the actuator and apparatus are not limited to that. Therefore, we do not wish to be limited to the details shown and described herein, but intend to cover all. such changes and modifications as are encompassed by the scope of the appended claims.

We claim:

1. A hot plug retainer and actuator for use on a chassis, said actuator comprising a one piece body having a first portion, a second portion and a living hinge pivotably connecting the first and second portions to one another for opening and closing the actuator, wherein said first portion includes snap tabs for stationarily mounting said first portion in an opening of said chassis where said second portion can be pivoted above said living hinge relative to said first portion and said chassis.

2. The actuator according to claim 1, wherein said one piece body is formed of plastic.

3. The actuator according to claim 2, wherein said plastic body comprises polymer chains which are aligned with one another in a direction along the length of said living hinge in a flexible area of said body forming said living hinge.

4. The actuator according to claim 2, wherein said one piece body is formed of molded PBT polyester resin.

5. The actuator according to claim 1, wherein said first portion includes an opening extending therethrough and said second portion includes a projection which moves into and out of said opening in the first portion during closing and opening of said actuator, respectively.

6. The actuator according to claim 5, wherein said projection has a cam formed thereon for actuating an adjacent switch in said chassis when said actuator is closed to inform a user that a component retained by said actuator is secured.

7. The actuator according to claim 1, further comprising cooperating members on said first and second portions which produce an audible snap upon closure of said actuator to enable a user to understand when the actuator is closed.

8. The actuator according to claim 1, wherein said actuator consists of a single plastic part.

9. The actuator according to claim 1, wherein said actuator is configured for retaining a PCI card or blanking panel in an I/O chassis.

10. The actuator according to claim 1, wherein said living hinge permits said first and second portions of said body to pivot relative to one another through an obtuse angle.

11. An apparatus for releasably retaining a component in a computer server, said apparatus comprising an I/O chassis in which a component can be installed and removed, and a retainer and actuator which can be opened and closed, for releasably retaining a component in said chassis and actuating a switch on said chassis when closing said actuator that informs the user that the component is secured and ready to use, said actuator having a one piece body with a first portion mounted on said chassis, a second portion and a living hinge pivotably connecting the first and second portions to one another for opening and closing the actuator.

12. The apparatus according to claim 11, wherein said first portion includes snap tabs stationarily mounting said first portion of said actuator body in an opening of said chassis where said second portion can be pivoted about said living hinge relative to said first portion and said chassis.

13. The apparatus according to claim 11, wherein said one piece body is formed of plastic.

14. The apparatus according to claim 13, wherein said plastic body comprises polymer chains which are aligned with one another in a direction along the length of said hinge in a flexible area of said body forming said living hinge.

15. The apparatus according to claim 13, wherein said one piece body is formed of molded PBT polyester resin.

16. The apparatus according to claim 11, wherein said actuator is mounted in an opening of said chassis, said first portion of said body having an opening therethrough in alignment with said opening in said chassis, said second portion having a projection thereon which moves into and out of said aligned openings of said body and said chassis during closing and opening of said actuator, respectively.

17. The apparatus according to claim 16, wherein said projection has a cam formed thereon for actuating an adjacent switch on said chassis when said actuator is closed to inform a user that a component retained in said chassis by said actuator is secured.

18. The apparatus according to claim 11, wherein said first and second portions of said body are formed with cooperating members that produce an audible snap upon closure of said actuator to enable a user to audibly understand when the actuator is closed.

19. The apparatus according to claim 11, wherein said actuator consists of a single plastic part.

20. The apparatus according to claim 11, wherein said actuator is configured for retaining a PCI card or blanking panel in said chassis.

21. The apparatus according to claim 11, wherein said living hinge permits said first and second portions of said body to pivot relative to one another through an obtuse angle.

22. A method for releasably retaining a component in an I/O chassis comprising:

provinding a single plastic part having a first relatively rigid portion with snap tabs for stationarily mounting said first portion in an opening of said I/O chassis, a second relatively rigid portion and a relatively flexible living hinge pivotably connecting the first and second portions to one another; and snapping said snap tabs of said plastic part into said opening of said I/O chassis to mount said first portion of said plastic part on said I/O chassis in fixed relation to said chassis such that said second portion can be pivoted relative to said first portion and said chassis between open and closed positions of said part for respectively releasing and retaining a component in said chassis.

23. The method according to claim 22, further comprising pivoting said second portion to said closed position to retain a component in said chassis and actuating a switch on said chassis with said second portion when pivoting said second portion to said closed position to inform a user that the component is secured and ready to use.

24. An apparatus for releasably retaining a component in a processor, said apparatus comprising an I/O chassis in which a component can be installed and removed, and a one piece plastic part mounted on said chassis, said part having a first relatively rigid portion, a second relatively rigid portion and a relatively flexible living hinge pivotably connecting the first and second portions to one another, said first portion being secured in fixed relation to said chassis by means on said first portion for snap fitting said first portion in an opening of said chassis and said second portion being arranged for pivoting relative to said first portion and said chassis between open and closed positions of said part for respectively releasing and retaining a component in said chassis.

25. The apparatus according to claim 24, wherein said second portion includes a cam which in said closed position of said part actuates a switch on said chassis that informs the user that the component is secured and ready to use.

26. A hot plug retainer and actuator for use on a chassis, said actuator comprising a one piece body having a first portion, a second portion and a living hinge pivotably connecting the first and second portions to one another for opening and closing the actuator;

wherein said first portion includes an opening extending therethrough and said second portion includes a projection which moves into and out of said opening in the first portion during closing and opening of said actuator, respectively; and wherein said projection has a cam formed thereon for actuating an adjacent switch in said chassis when said actuator is closed to inform a user that a component retained by said actuator is secured.

* * * * *